United States Patent
Cites et al.

(10) Patent No.: US 7,312,154 B2
(45) Date of Patent: Dec. 25, 2007

(54) METHOD OF POLISHING A SEMICONDUCTOR-ON-INSULATOR STRUCTURE

(75) Inventors: Jeffrey Scott Cites, Horseheads, NY (US); Charles Michael Darcangelo, Corning, NY (US); Steven Joseph Gregorski, Painted Post, NY (US); Richard Orr Maschmeyer, Corning, NY (US); Mark Andrew Stocker, Painted Post, NY (US); John Christopher Thomas, Elmira, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/314,060

(22) Filed: Dec. 20, 2005

(65) Prior Publication Data

US 2007/0138141 A1 Jun. 21, 2007

(51) Int. Cl.
*H01L 21/461* (2006.01)
(52) U.S. Cl. .............. 438/691; 438/692; 216/84; 216/85; 216/89
(58) Field of Classification Search ........ 438/691, 438/692; 451/290; 216/84, 85, 89
See application file for complete search history.

(56) References Cited

U.S. PATENT DOCUMENTS 5,658,183 A    8/1997  Sandhu et al. ............. 451/5
6,165,057 A *  12/2000 Gill, Jr. .................... 451/287
6,322,422 B1   11/2001 Santou ....................... 451/8
6,506,102 B2   1/2003  Kordonski et al. ......... 451/64
6,527,625 B1   3/2003  Kajiwara et al. ........... 451/41
6,555,017 B1   4/2003  Rushford et al. ........... 216/84
6,796,877 B1   9/2004  Bingham et al. ........... 451/5
2004/0263868 A1* 12/2004 Isei et al. .................. 356/630
2005/0014376 A1  1/2005  Shiho et al. ............... 438/690
2005/0146728 A1  7/2005  Tang ......................... 356/504
2005/0250302 A1* 11/2005 Todd et al. ................ 438/607
2006/0068681 A1*  3/2006  Tsuchiya ................... 451/5
2006/0166464 A1*  7/2006  Jakob et al. ............... 438/460

FOREIGN PATENT DOCUMENTS

EP       0904895 A2    3/1999
EP       0905767 A1    3/1999
WO       WO 96/38254   12/1996
WO       WO 2004/081258 A2  9/2004

OTHER PUBLICATIONS

Society of Vacuum Coaters 1998 Meeting, Boston, MA. Fred Goldstein, FTG Software Associates, Princeton, NJ, "Film Thickness of 'Thick Thin Films' by Spectroscopy".

* cited by examiner

*Primary Examiner*—Binh X. Tran
(74) *Attorney, Agent, or Firm*—Kevin M. Able

(57) ABSTRACT

A method of polishing a semiconductor layer formed on a transparent substrate is described, the method including measuring the thickness of the semiconductor from the substrate side of the semiconductor layer simultaneously with the polishing, and using the thickness measurement to modify the polishing.

19 Claims, 9 Drawing Sheets

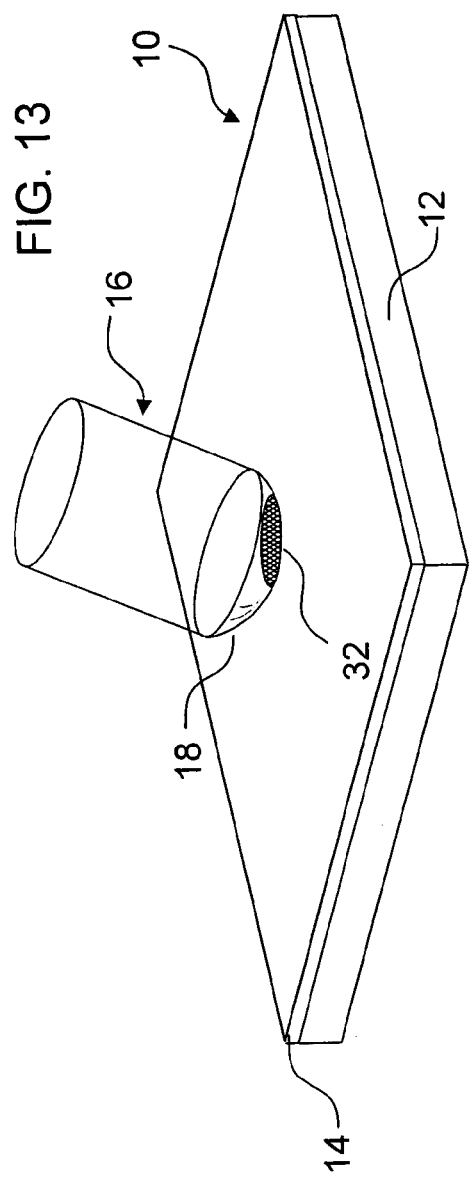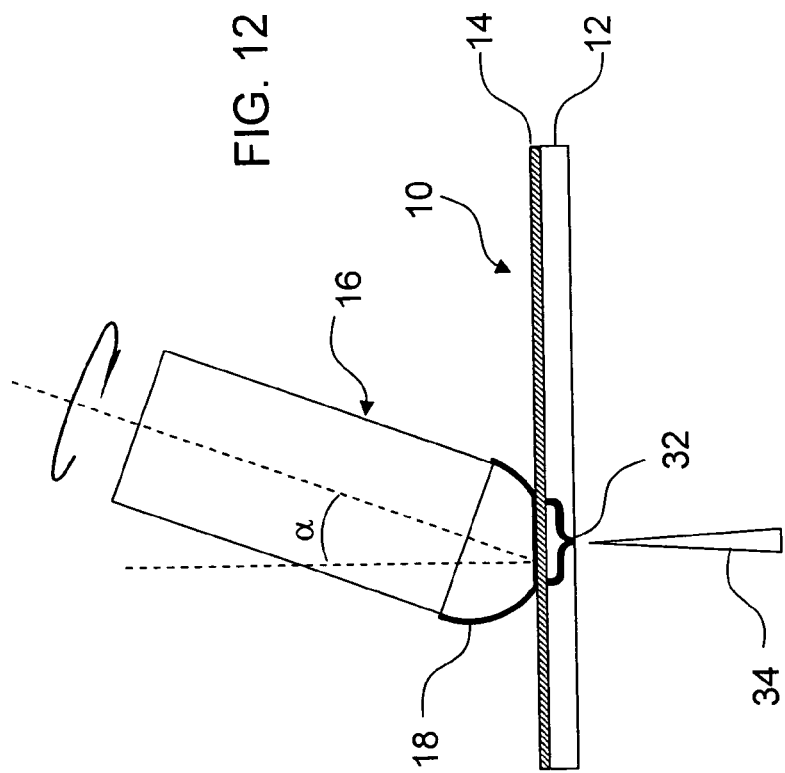

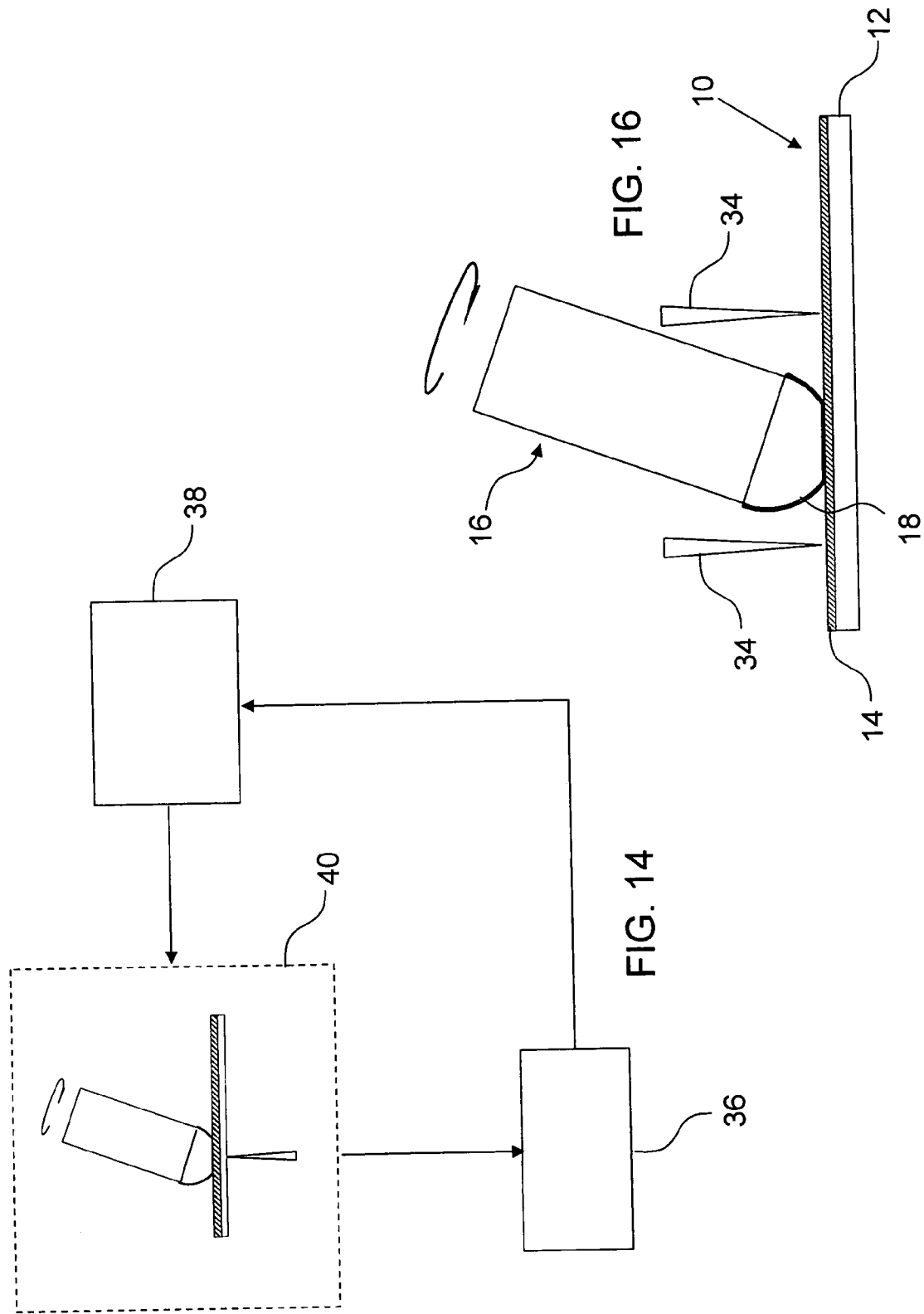

METHOD OF POLISHING A SEMICONDUCTOR-ON-INSULATOR STRUCTURE

BACKGROUND OF THE INVENTION

1. Field of the Invention

The present invention relates to semiconductor-on-insulator (SOI) structures and more particularly methods for polishing the semiconductor layer of such structures.

2. Technical Background

To date, the semiconductor material most commonly used in semiconductor-on-insulator structures has been silicon. Such structures have been referred to in the literature as silicon-on-insulator structures and the abbreviation "SOI" has been applied to such structures. Silicon-on-insulator technology is becoming increasingly important for high performance thin film transistors, solar cells, and displays, such as active matrix displays. Silicon-on-insulator wafers consist of a thin layer of substantially single crystal silicon (generally 0.1-0.3 microns in thickness but, in some cases, as thick as 5 microns) on an insulating material. As used herein, SOI shall be construed more broadly, to include semiconductor materials other than and including silicon.

Various ways of obtaining SOI structures include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that needed for oxygen ion implants and the dosage required is two orders of magnitude lower.

Exfoliation by the hydrogen ion implantation method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond. The wafers are then heat-treated to about 600° C. to cause growth of the subsurface flaws for use in separating a thin layer of silicon from the Si wafer. The resulting assembly is then heated to a temperature above 1,000° C. to fully bond the Si film with $SiO_2$ underlayer to the support substrate, i.e., the unimplanted Si wafer. This process thus forms an SOI structure with a thin film of silicon bonded to another silicon wafer with an oxide insulator layer in between. This technique has been applied more recently to SOI structures wherein the substrate is a glass or glass ceramic rather than another Si wafer.

Once the SOI structure has been bonded to a thin film of silicon, it is typically necessary to polish the surface of the silicon layer to produce a layer having a substantially uniform thickness in order to facilitate the formation of thin film transistor (TFT) circuitry on the silicon. Conventional methods of polishing silicon wafers typically employ a piece-wise approach. That is, the thickness of the wafer as a function of location across the wafer is first determined. The wafer is then placed within an appropriate polishing jig, or holder, and the surface of the wafer polished. From time to time the wafer is removed from the holder and re-measured to determine the progress of the polishing step. Such a discontinuous method assumes that the polishing process is stable: i.e. the polishing parameters are consistent throughout the operation (e.g. temperature, slurry ph, wafer position, etc.). In reality, such parameters may be variable, affecting the results of the polishing process. This variability is exacerbated when applying the technique to large, thin sheets of glass substrate used in the manufacture of panels for electroluminescent displays. Glass sheets from which such panels are eventually cut can be several square meters or more in size, and be less than about one-half millimeter in thickness. The large size and thinness of the glass substrate results in the potential for sagging of the glass substrate, and difficulty accurately polishing a semiconductor layer on a surface thereof.

SUMMARY

Embodiments of the present invention provide a method for polishing a semiconductor layer formed on a substrate. More particularly, the method can be used for polishing a thin semiconductor layer, or film, formed on a transparent glass substrate such as substrates commonly used to manufacture flat panel displays. Such substrates are typically less than about 2 mm in thickness (e.g. less than about 1 mm, and preferably less than about 0.7 mm), and are considerably larger than, for example, semiconductor wafers used within the electronics/computer industry. For example, glass substrates used in flat panel display applications often exceed a surface area (as measured on a single surface—e.g. the top or bottom), of about 0.25 $m^2$, and may be at least several square meters in area. It is this nature of the substrate, being physically large and thin, which leads to difficulty polishing an adhered semiconductor layer by conventional methods unless the substrate is supported by a rigid support or chuck, which generally precludes access to the back of the substrate. On the other hand, when a large, thin sheet of glass substrate is supported horizontally only by the edges of the substrate, the substrate tends to sag downward in the middle due to gravitational effects.

Briefly described, one embodiment of the method according to the present invention, among others, can be implemented as described herein. The embodiment includes providing an insulating substrate, the substrate preferably being transparent over a wavelength range of between about 200 nm to 2 μm and having a first side and a second side, the substrate further including a layer of semiconductor material on the substrate first side, polishing the semiconductor layer to produce a substantially uniform thickness of semiconductor material on the substrate first side, and simultaneous with the step of polishing the semiconductor material, measuring a thickness of the semiconductor layer from the second side of the substrate and using the semiconductor thickness measurement to modify the polishing. The insulating substrate is preferably a glass or glass-ceramic, and typically less than about 1 mm in thickness. Preferably, the semiconductor thickness is measured at a material removal zone.

Useful semiconductor materials for practicing the method include, but are not limited to, silicon (Si), silicon germanium (SiGe), silicon carbide (SiC), germanium (Ge), gallium arsenide (GaAs), GaP, and InP.

To ensure rigidity of the substrate during the time the polishing is occurring, the substrate is preferably supported by a fluid bearing, such as an air bearing or a hydrostatic bearing. Such bearings are advantageous since they do not contact the substrate with a hard, potentially damaging surface. For example, air bearing support of the substrate is accomplished by providing a cushion of air beneath the substrate. The fluid bearing is preferably located opposite a material removal zone on the semiconductor material so that the area from which semiconductor material is removed is supported. As the material removal zone is translated across the surface of the semiconductor layer, the fluid bearing follows, so that the material removal zone continues to be supported. The fluid bearing preferably includes a port or access area through which a thickness of the semiconductor layer can be measured during the polishing process.

In some embodiments, it may be advantageous to first perform chemical mechanical planarization to remove the bulk of the material slated for removal, and thereafter employing the method according to the present invention to complete the polishing and ensure a substantially uniform thickness of the semiconductor layer on the substrate.

In another embodiment, a method of polishing a semiconductor layer bonded to a substrate is disclosed comprising providing a non-planar substrate having a first side and a second side and a semiconductor layer bonded to the first side, the semiconductor layer having an exposed surface area, polishing the semiconductor layer within at least one sub-aperture material removal zone, developing relative motion between the at least one material removal zone and the semiconductor layer, and simultaneous with the polishing, measuring a thickness of the semiconductor layer. The measured thickness of the semiconductor layer is used to modify the polishing so as to produce a substantially uniform thickness of the semiconductor layer over the exposed surface area.

In certain other embodiments, a method of polishing a semiconductor layer bonded to a glass substrate is described comprising providing a transparent glass substrate, the substrate having a first side and a second side and including a semiconductor layer having an initial thickness bonded to the substrate first side. The substrate typically has a waviness greater than about an order of magnitude larger than the initial thickness of the semiconductor layer. The seminconductor layer is polished using sub-aperture polishing to produce a substantially uniform thickness of the semiconductor layer over the top of the substrate. To ensure a uniform thickness, the semiconductor layer intermediate thickness is also measured during the polishing process. Preferably, the semiconductor thickness is measured from the substrate second side. In some embodiments, the semiconductor thickness can be measured at a plurality of locations simultaneous with the polishing. Preferably, the semiconductor thickness is measured at a material removal zone. In some embodiments, the intermediate thickness of the semiconductor layer is measured simultaneously with the polishing. In other embodiments, the polishing process may be halted and the intermediate thickness measured, after which the polishing process is resumed.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods features and advantages be included within this description, be within the scope of the present invention, and be protected by the accompanying claims.

BRIEF DESCRIPTION OF THE DRAWINGS

FIG. 12 is a side view depicting a method of polishing a semiconductor layer on a substrate showing a polishing member in contact with the semiconductor layer.

FIG. 13 is a perspective view, in transparency, of the polishing method of FIG. 12 showing the material removal zone.

FIG. 14 is a block diagram of a system for polishing a substrate-semiconductor laminate.

FIG. 16 is a side cross sectional view of a method of polishing a substrate-semiconductor laminate via pseudo-closed loop feedback.

DETAILED DESCRIPTION

Figure 1:
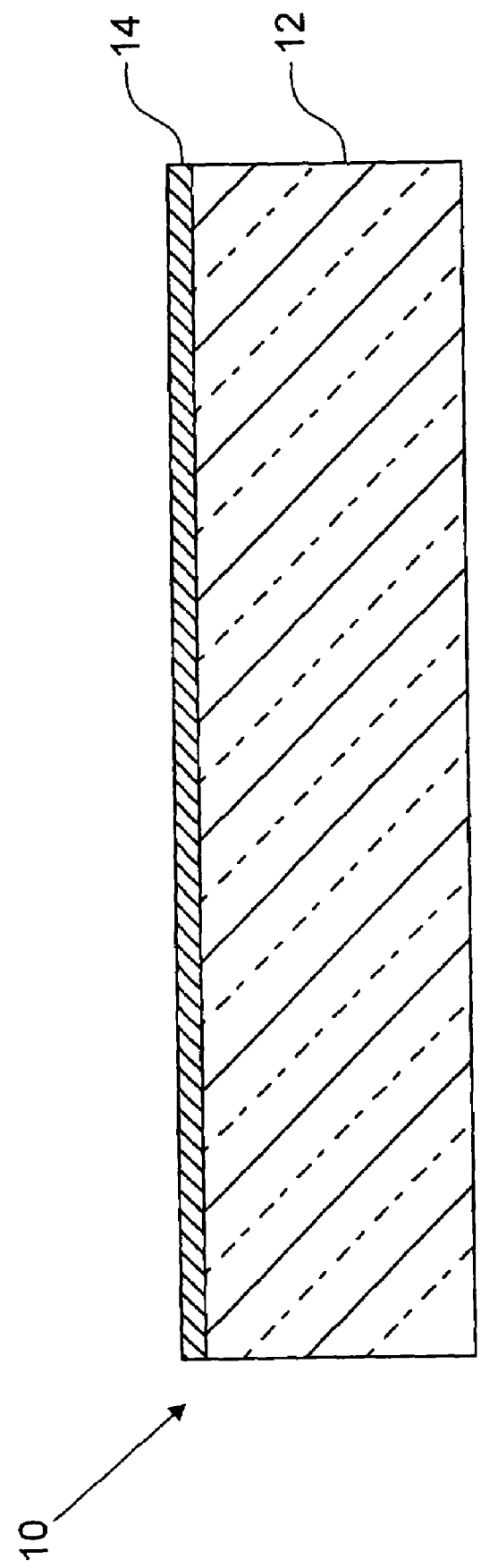
FIG. 1 is a cross sectional side view of a substrate having a layer of semiconductor material on the top of the substrate.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

The present invention relates to a method of manufacturing a silicon-on-insulator structure, and in particular to the polishing of a silicon layer formed on a glass substrate. The present invention makes use of a real-time measurement system capable of providing real-time film thickness data to the measurement apparatus, thereby significantly improving the polishing accuracy of such a system (i.e. accuracy in the amount of material removed from the semiconductor layer during polishing). The present invention also provides a method and apparatus for making the thin substrate rigid in the area in the vicinity of the polishing.

FIG. 1 is a cross section view of an SOI structure 10 comprising a glass or glass-ceramic substrate 12 having at least one layer of semiconductor material 14 on top of the substrate. The SOI structure 10 has suitable uses in connection with fabricating thin film transistors (TFTs), e.g., for display applications, including organic light-emitting diode (OLED) displays and liquid crystal displays (LCDs), integrated circuits, photovoltaic devices, etc.

Substrate 12 is preferably formed from an oxide glass or an oxide glass-ceramic. Although not required, the embodiments described herein preferably include an oxide glass or glass-ceramic exhibiting a strain point of less than about 1,000° C. As is conventional in the glass making art, the strain point is the temperature at which the glass or glass-ceramic has a viscosity of $10^{14.6}$ poise ($10^{13.6}$ Pa·s).

By way of example, substrate 12 may be formed from glass substrates containing alkaline-earth ions, such as substrates made of Corning Incorporated glass composition no. 1737 or Corning Incorporated glass composition Eagle 2000™. These glass materials have particular use in, for example, the production of liquid crystal displays.

Substrate 12 preferably has a thickness in the range of about 0.1 mm to about 10 mm and most preferably in the range of about 0.5 mm to about 1 mm. For some SOI structures, insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a substrate 12 having a thickness that is greater than or equal to about 1 micron. A preferred lower limit on the thickness of the substrate 12 is thus about 1 micron.

In general, substrate 12 should be thick enough to support the at least one semiconductor layer 14 through the process steps of the invention, as well as subsequent processing performed on the SOI structure 10. Although there is no theoretical upper limit on the thickness of substrate 12, a thickness beyond that needed for the support function or that desired for the ultimate SOI structure 10 is generally not preferred since the greater the thickness of substrate 12, the more difficult it will be to accomplish at least some of the process steps in forming the SOI structure 10.

Substrate 12 is preferably silica-based glass or glass-ceramic. Thus, the mole percent of $SiO_2$ in the oxide glass or oxide glass-ceramic is preferably greater than 30 mole % and most preferably greater than 40 mole %. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less preferred because of their higher cost and/or inferior performance characteristics. Similarly, for some applications, e.g., for SOI structures employing semiconductor materials that are not silicon-based, glass substrates which are not oxide based, e.g., non-oxide glasses, may be desirable, but are generally not preferred because of their higher cost.

For certain applications, e.g., display applications, the glass or glass-ceramic substrate 12 is preferably transparent in the visible, near UV, and/or IR wavelength ranges, e.g., the glass or glass ceramic substrate 12 is preferably transparent in the 200 nm to 2 micron wavelength range.

Although substrate 12 is preferably composed of a single glass or glass-ceramic, laminated structures can be used if desired. When laminated substrate structures are used, the layer of the laminate closest to the at least one semiconductor layer 14 preferably has the properties discussed herein for substrate 12 composed of a single glass or glass-ceramic. Substrate layers farther from semiconductor layer 14 preferably also have those properties, but may have relaxed properties because they do not directly interact with the semiconductor layer 14. In the latter case, substrate 12 is considered to have ended when the properties specified for substrate 12 are no longer satisfied.

The semiconductor material or materials comprising semiconductor layer 14 preferably include a substantially single-crystal material. The word "substantially" is used in describing layer 14 to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that semiconductor layer 14 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), silicon germanium (SiGe), silicon carbide (SiC), germanium (Ge), gallium arsenide (GaAs), GaP, and InP.

The thickness of semiconductor layer 14 may be between about 5 nm to about 10 microns (10,000 nm), and typically between about 500 nm and 900 nm, although other thicknesses including greater thicknesses may be employed depending on the particular application of the structure 10.

Semiconductor material 14 may be formed on substrate 12 through a variety of methods. For example, the semiconductor material may be formed by vapor deposition, sputtering, or by bonding a relatively thick semiconductor wafer to the substrate, and, through ion implantation and exfoliation, reducing the relatively thick semiconductor layer (e.g. about 600-1500 µm) to a relatively thin semiconductor layer (e.g. approximately 500 nm). The exfoliation method is described, for example, in U.S. patent application Ser. No. 11/159,889, the contents of which are incorporated herein in their entirety by reference. Portions of this process are discussed below. The following description of embodiments of the present invention will be discussed in terms of the exfoliation technique, but those of ordinary skill in the art will appreciate that the polishing methods described herein are applicable to polishing semiconductor-substrate structures formed by other methods.

Figure 2:
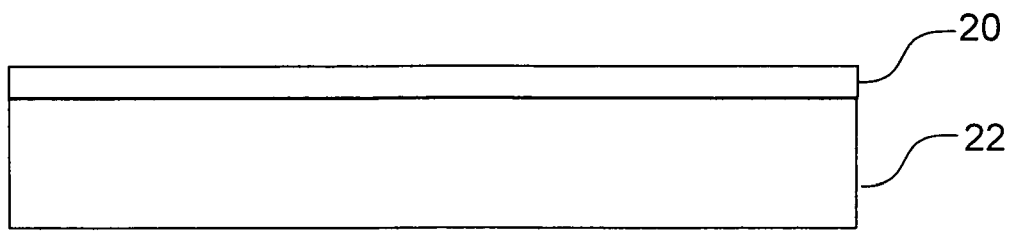
FIG. 2-4 are block diagrams illustrating a process of forming an intermediate structure in connection with forming the SOI structure of FIG. 1.

As described in U.S. patent application Ser. No. 11/159,889 and depicted in FIG. 2, a first porous layer 20 of relatively fine pores is formed on a surface of a semiconductor wafer 22. For the purposes of discussion, the semiconductor wafer 22 is preferably a substantially single crystal Si wafer, although any other suitable semiconductor conductor material may be employed.

The first porous layer 20 is preferably produced via anodization, which is an electrochemical etching process. The semiconductor wafer 22 is immersed in a suitable electrolyte solution and used as one electrode of a pair of electrodes. The other electrode may be formed from any suitable material, such as a corresponding semiconductor material (e.g., silicon), platinum, a noble metal, or any other suitable metal or conductive material.

A voltage is applied across the electrodes, preferably with the potential such that the semiconductor wafer 22 operates as an anode. The magnitude of the voltage is preferably adjusted to create a suitable current through the semiconductor wafer 22, electrolyte solution, and other electrode in order to induce electrochemical etching of the surface of the semiconductor wafer 22. It is preferred that the pores created utilizing the anodization process are on the nm scale within the first porous layer 20.

Figure 3:
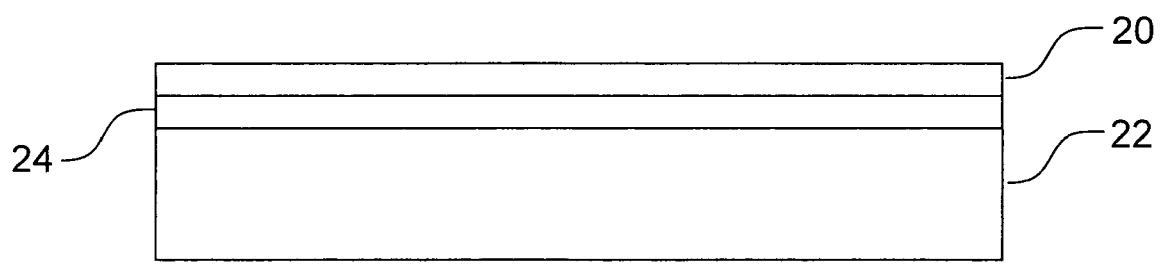

Referring to FIG. 3, a second porous layer 24 is preferably created below the first porous layer 20 such that the pores of the second porous layer 24 are relatively larger than the pores of the first porous layer 20.

Those skilled in the art will appreciate that the current amplitude, electrolyte concentration, resistivity of the electrodes and solution, and time of application are variables in connection with achieving particular pore sizes, pore densities, and layer thicknesses. By way of example, the thickness of the second porous layer may be about the same thickness as the first porous layer 20.

Semiconductor wafer 22 is preferably washed and cleaned and the first porous layer 20 is preferably subject to mild oxidation. Preferably, the thickness of the oxide layer is from about 1 nm to about 3 nm.

Figure 4:
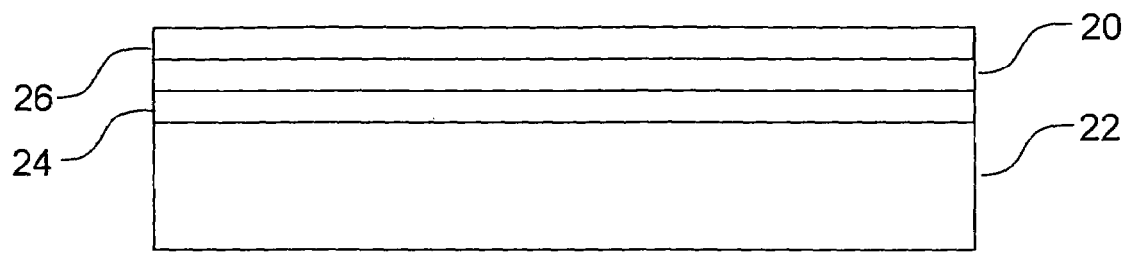

Referring now to FIG. 4, an epitaxial semiconductor layer 26 may be formed directly or indirectly on the first porous layer 20. In keeping with the example hereinabove, the epitaxial layer 26 is preferably a silicon layer, although other semiconductor materials may be employed. The epitaxial silicon layer may be formed by chemical vapor deposition, sputtering, e-beam evaporation, thermal evaporation, or other suitable processes. Preferably, the epitaxial silicon layer 26 is of a substantially single crystal structure and may be between about 5 nm to about 10 microns (10,000 nm) thick, although other thicknesses including greater thicknesses may be employed depending on the particular application of the structure 10. The glass substrate 12 is then bonded to the epitaxial semiconductor layer 26 using, for example, an electrolysis process.

As an initial step in an electrolysis process, the glass substrate 12 is cleaned and any suitable surface preparation steps are carried out. Then the glass substrate is brought into contact with the epitaxial semiconductor layer 26. Prior to or after the contact, the semiconductor wafer-epitaxial layer structure (the "wafer 22" for short) and the glass substrate 12 are heated under a differential temperature gradient.

Once the temperature differential between the glass substrate 12 and the semiconductor wafer 22 is stabilized, any spacers may be removed and mechanical pressure is applied to the intermediate assembly.

The glass substrate 12 and the semiconductor wafer 22 are heated, and a voltage is applied across the intermediate assembly, preferably with the semiconductor wafer 22 at the positive electrode and the glass substrate 12 the negative electrode. The application of the voltage potential causes alkali or alkaline earth ions in the glass substrate 12 to move away from the semiconductor/glass interface further into the glass substrate 12. This accomplishes two functions: (i) an alkali or alkaline earth ion free interface is created; and (ii) the glass substrate 12 becomes very reactive and bonds to the epitaxial semiconductor layer 26 strongly with the application of heat at relatively low temperatures. After the intermediate assembly is held under these conditions for a pre-determined period of time, the voltage is removed and the intermediate assembly is allowed to cool to room temperature. The semiconductor wafer 22 and the glass substrate 12 are then separated, which may include some peeling if they have not already become completely free, to obtain a glass substrate 28 with a thin epitaxially grown semiconductor layer 26 bonded thereto.

The separation is preferably accomplished via fracture of the larger pores of the second layer 24 due to thermal stresses. Alternatively or in addition, mechanical stresses such as water jet cutting or chemical etching may be used to facilitate the separation.

Figure 5:
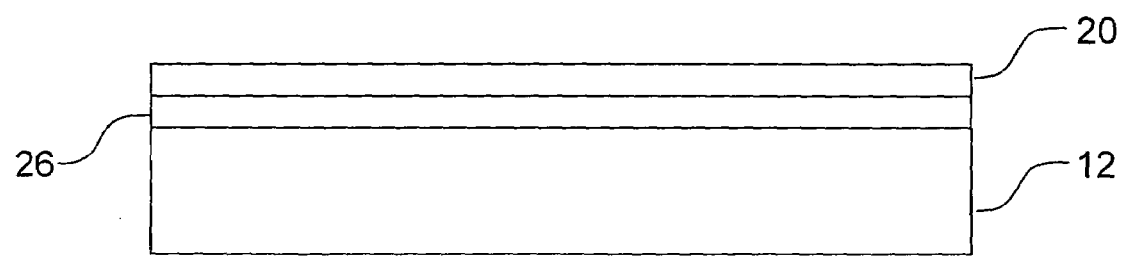
FIG. 5 is a block diagram illustrating a process of separating certain layers of the intermediate structure of FIG. 4 in connection with forming the SOI structure of FIG. 1.

Thus, after separation and as illustrated in FIG. 5, the resulting structure 10 may include the glass substrate 12, and semiconductor layer 14 may include the epitaxial semiconductor layer 26 bonded to the substrate, and at least a portion of the first porous layer 20 (if not a portion of the second porous layer 24). Thereafter, the surface of the semiconductor layer is polished in accordance with the polishing techniques of the present invention to obtain the desired thickness of semiconductor layer 14 on glass substrate 12.

Polishing of thin films is well-known in the semiconductor wafer industry. However, in the semiconductor industry, the films are deposited onto substrates having surfaces which are typically flat and parallel. Such materials easily lend themselves to semiconductor material removal through conventional chemical mechanical planarization (CMP) methods.

CMP polishing methods have a limited ability to correct non-uniform film thickness—they are essentially averaging processes which employ large polishing pads (typically larger than the semiconductor wafer to be polished), to machine the film by preferentially removing high spots until the wafer is planarized. Once the wafer is planarized, continued polishing results in a bulk removal of material. A final polishing step is often performed to achieve the desired surface finish. Typically, polishing pads of different hardness and compliance are used for each stage of the material removal process. One factor for determining the appropriate hardness of the polishing pads is the need to provide a suitable level of pad conformity to surface waviness of the semiconductor layer to be polished. If the substrate is flat, but the film has variable thickness, a harder pad would be used to planarize the film thickness by preferentially removing film material from the high spots. The first polishing step would be performed using a hard pad surface coupled with a soft underlayer. The cushioned hard surface delivers the flattest surface with a high material removal rate. A second polishing step follows using a soft, conformal pad to deliver the smoothest surface.

If the substrate includes low frequency waviness, but the film thickness is very uniform, a softer pad would be used to conform to the film's top surface and remove a uniform amount of film material.

Both of the CMP processes described supra have only a limited ability to correct their respective target errors and tend to lose control if significant material removal is required. Typically, the uniformity of material removal by CMP is limited to about 5% of the film thickness to be removed. Film thickness tolerances are therefore often 5% of the final film thickness. Thus, for a film having an initial 500 nm thickness, which is reduced to a thickness of 80 nm through CPM, the actual film thickness variability would be about 21 nm, compared to a required variability of 4 nm.

SOI structures used in display applications typically use a thin (e.g. a thickness on the order of less than about 0.7 mm), transparent glass manufactured for flat panel displays as a substrate. The surface of the glass generally has a variable flatness, both in pitch and amplitude, and variable total thickness variation (TTV). The waviness of such substrates (generally measured as the peak-to-valley deviation in the surface flatness of the substrate) is typically at least an order of magnitude greater than the thickness of the semiconductor layer, although generally less than about 20 µm. For example, given an initial semiconductor thickness of about 500 nm, the waviness of the substrate (and hence the semiconductor layer deposited thereon), may be in excess of 5 µm. This large waviness makes conventional polishing of the substrate to a uniform thickness difficult or impossible using conventional CMP methods. The following discussion, by way of example, will make more clear the various limitations of CMP.

Figure 6:
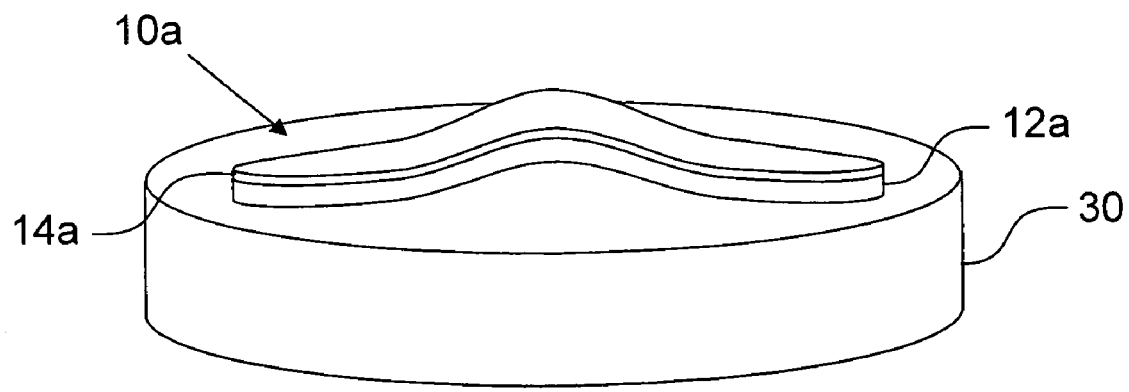
FIG. 6 is a perspective view of a substrate-semiconductor laminate having a low frequency, low amplitude flatness error and a low total thickness variation (TTV).
Figure 7:
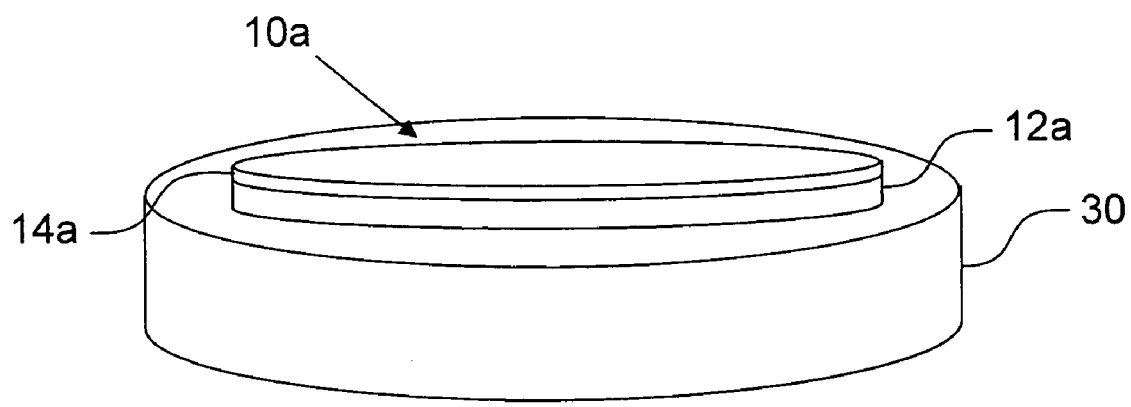
FIG. 7 is a perspective view of the substrate-semiconductor laminate of FIG. 6 flattened on a vacuum platen.

Referring now to FIG. 6, there is shown an illustration of a semiconductor-substrate laminate 10a, supported on vacuum platen 30, and comprising a substrate 12a having a semiconductor layer 14a formed on the upper surface thereof. Wafer 10a exhibits a low frequency, low amplitude flatness error, as well as a low TTV, e.g. the wafer is substantialy uniform in thickness but has a low frequency waviness. This shape exemplifies a typical silicon wafer used in the semiconductor/electronics industry. As depicted in FIG. 7, wafer 10a of FIG. 2 can be easily pulled flat by vacuum platen 30, making the wafer an ideal candidate for CMP finishing.

Figure 8:
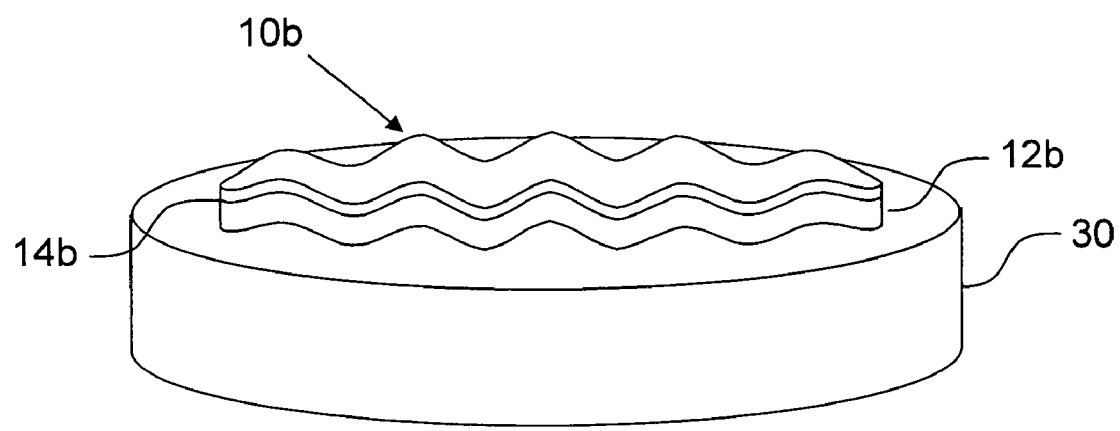
FIG. 8 is a perspective view of a substrate-semiconductor laminate displaying high frequency flatness error and low TTV.
Figure 9:
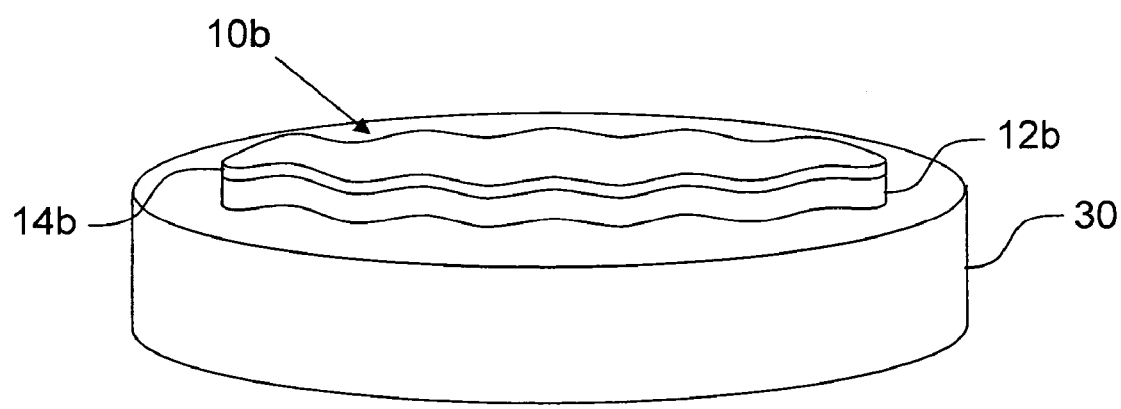
FIG. 9 is a perspective view of an attempt to flatten the substrate-semiconductor laminate of FIG. 8 on a vacuum platen.

FIG. 8 shows a semiconductor wafer 10b, comprising a substrate 12b having a semiconductor layer 14b formed on the upper surface thereof displaying a high frequency, low TTV error—the wafer is again substantialy uniform in thickness, but has increased waviness. As illustrated by FIG. 9, such a wafer cannot be pulled into shape by vacuum platen 30. Conventional polishing using large pads for material removal will tend to preferentially remove material from the high spots.

Figure 10:
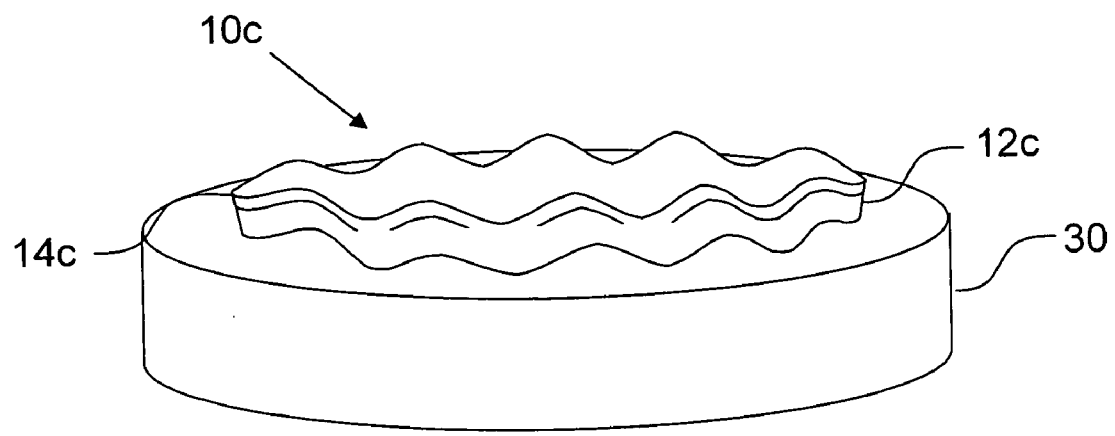
FIG. 10 is a perspective view of a substrate-semiconductor laminate having both a high frequency flatness error and high TTV.
Figure 11:
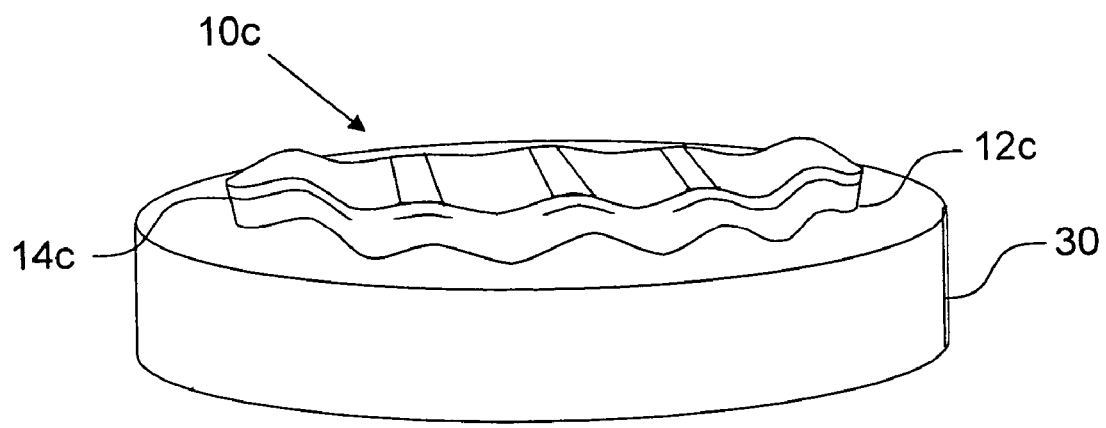
FIG. 11 is a perspective view of an attempt to polish the substrate-semiconductor laminate of FIG. 10 using a conventional CMP technique.

Finally, FIG. 10 depicts a semiconductor wafer 10c comprising a substrate 12c having a semiconductor layer 14c formed on the upper surface thereof displaying both a high frequency ripple and TTV typical of flat panel display glass. That is, the wafer has variable thickness, due largely to thickness variation in the substrate, and substantial waviness. Again, this substrate-semiconductor wafer can not be pulled flat by vacuum platen 30, as shown in FIG. 11. Conventional (CMP), polishing of semiconductor layer 12c at the top surface of wafer 10c will tend to produce a semiconductor layer having variable thickness, or worse—patching when the semiconductor material is completely locally removed and the substrate is exposed. Thus, CMP is not well-suited to the polishing of such SOI structures, as the semiconductor material removal capabilities depend upon the flatness and TTV of the glass substrate. To effect an appropriate amount of material removal for glass-substrate SOI structures employing a semiconductor layer on a thin glass substrate, particularly if the substrate has a non-uniform thickness and exhibits waviness (i.e. is non-planar), a process is required which is capable of selective removal of semiconductor material while simultaneously maintaining film (semiconductor) thickness uniformity regardless of the substrate geometry and the homogeneity of the semiconductor material's removal properties.

In accordance with embodiments of the present invention, a sub-aperture machining tool (or a sub-aperture removal process zone) is translated across the surface of the semiconductor material in a SOI structure. By sub-aperture what is meant is that the removal zone is significantly smaller than the SOI structure to be polished, and the process can be modified such that the material removal rate can be varied to correct film thickness variability. Shown in FIG. 12 is a representation of sub-aperture polishing using a mechanical removal tool. FIG. 12 depicts SOI structure 10 comprising substrate 12 and semiconductor layer 14 on the upper surface of substrate 12. Also shown is polishing member 16, including polishing portion 18. Polishing portion 18 as depicted in FIG. 12 has an arcuate outside surface comprising an abrasive grit of an appropriate size and hardness for the semiconductor material. The choice of grit size and hardness is a process variable which is chosen based on, among other things, the amount of material removal desired, and the speed of removal. However, it should be noted that an arcuate outside surface is not necessary, and polishing portion 18 may be different shapes depending upon such factors as the shape of the surface to be polished. Polishing portion 18 is preferably complaint, being capable of deforming to the shape of the surface being polished. A sub-aperture material removal zone is defined as the area of the semiconductor material subject to material removal at any one time. For example, FIG. 12 shows polishing member 16 in contact with a surface being polished (e.g., the surface of a semiconductor layer). The area across the surface of the material being polished which is in contact with the polishing portion 18 is the material removal zone 32, and is shown in FIG. 12 as a one dimensional representation of a sub-aperture material removal zone. Sub-aperture material removal zone 32 is shown in perspective in FIG. 13 as a two-dimensional area over a portion of semiconductor layer 14. Polishing member 16 is shown as transparent in FIG. 13 so the material removal zone can be seen. A suitable sub-aperture removal apparatus, of which polishing member 16 is a component, is described, for example, in U.S. Pat. No. 6,796,877 to Bingham, et al., the contents of which are incorporated herein in their entirety, by reference. However, those skilled in the art will appreciate that other material removal processes wherein the material removal zone is much smaller than the size of the workpiece may be effectively applied. For example, plasma assisted chemical etching may be applied.

To provide real-time data indicating the thickness of semiconductor layer 14 directly beneath sub-aperture removal zone 32, probe beam 34 is directed at the semiconductor layer from the substrate side of the semiconductor layer as illustrated in FIG. 12, i.e. probe beam 34 traverses the thickness of substrate 12 before contacting semiconductor layer 14. Probe beam 34 is preferably a light from a broadband source. Preferably, the broadband light from the broadband light source has a spectral content extending over a wavelength range between about 200 nm and 800 nm. Methods for calculating the thickness of a thin semiconductor layer are well-known in the art, and will not be described in depth here. In brief, the semiconductor layer on the substrate can behave as an etalon. When viewed in reflection, the layer (film) can create an interference pattern superimposed on the surface reflectivity of the layer. Typically, optical spectroscopy is employed, wherein the light from probe beam 34 which has been reflected within the layer to be measured is captured by a suitable capture device (e.g. a spectrometer, associated detector and other electronic components) and the resultant data analyzed with the aid of a computer and appropriate software. Spacing of the subsequent interference peaks, when combined with the index of refraction of the semiconductor layer, can be used to calculate the thickness of the material (see, for example, "Film Thickness of 'Thick Thin Films' by Spectroscopy", by Fred Goldstein, Society of Vacuum Coaters 1998 Meeting, Boston, Mass.). Advantageously, the use of a transparent glass or glass ceramic for substrate 12 allows the application of conventional thin film thickness measurement methods simultaneous with the removal of material from the semiconductor layer, thus facilitating a closed loop feedback polishing process. Data from thickness measurement apparatus 36 is used to monitor the intermediate thickness of semiconductor layer 14 within the sub-aperture removal zone as the polishing progresses. Data from the measurement may be incorporated into an automated control system, illustrated in the block diagram of FIG. 14, including microprocessor (computer, etc.) 38, which may then be used to control polishing apparatus 40 (comprising polishing member 16) and thereby adjust or modify the material removal parameters, such as, for example, polishing member dwell time at a specific location, polishing member rotational speed, polishing member angle relative to the surface being polished, etc., thereby varying the amount of material which is removed at any one location. The material removal parameters which are available for modification would be those parameters relevant to the particular removal method chosen.

Figure 15:
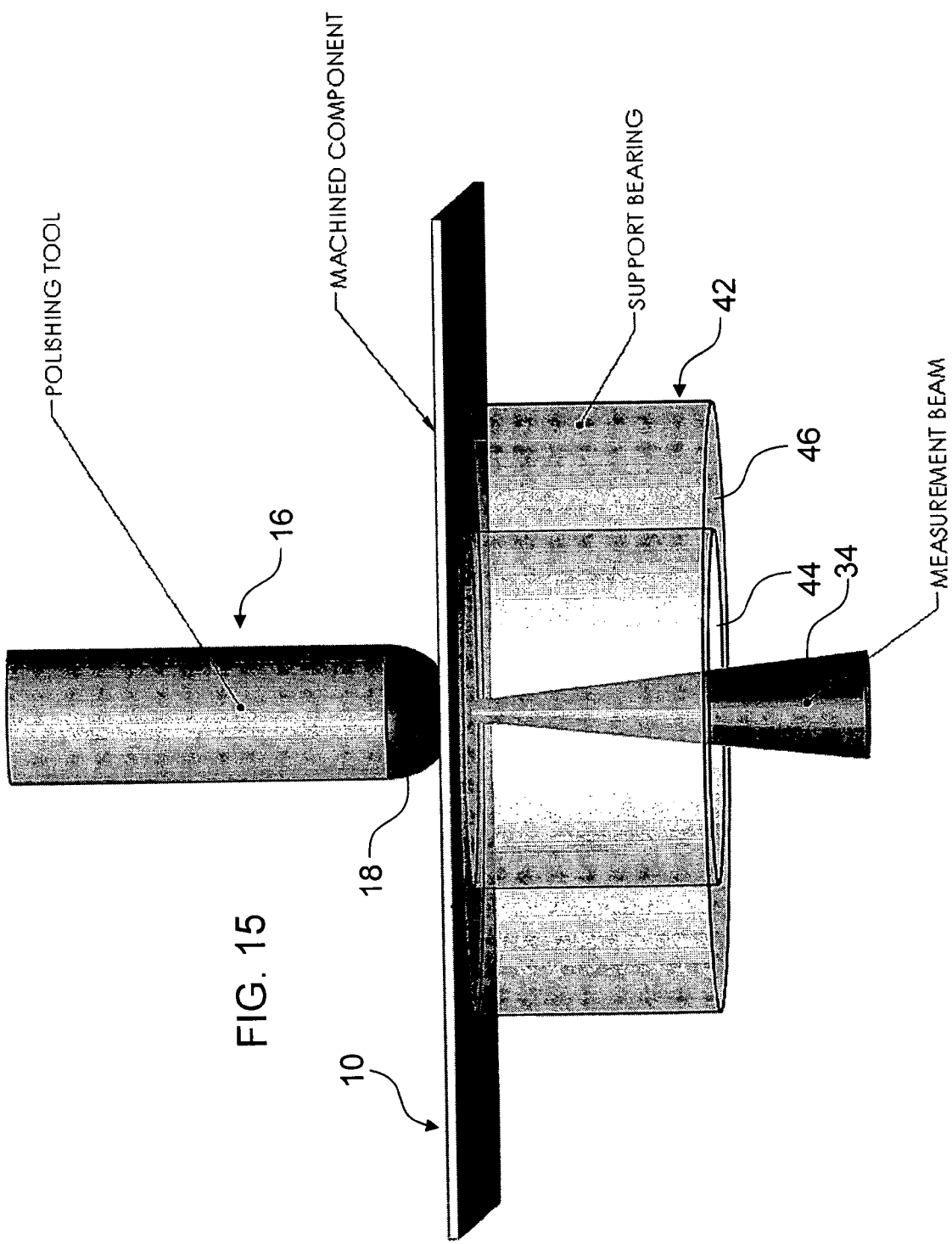
FIG. 15 is a perspective view of a substrate semiconductor laminate supported by an air bearing during a polishing operation.

To facilitate closed-loop feedback of the semiconductor layer within the material removal zone, a support device capable of both locally supporting the glass substrate in the vicinity of the region being polished, and providing access to the surface of the substrate opposite the material removal zone may be employed. For example, fluid bearings, such as air or hydrostatic bearings, make excellent supports. As illustrated in FIG. 15, in one embodiment, support 42 comprises an air bearing. Support (air bearing) 42 comprises a central opening 44 through which probe beam 34 passes. Support 42 also includes annular passage 46 into which a pressurized gas, such as air, is injected from a source (not shown) into one end of the passage, and exits from the opposite end of the passage directly adjacent the substrate to be supported, thereby supporting SOI structure 10 in the vicinity of material removal zone 32. SOI structure 10 may be polished by translating polishing member 16 with respect to SOI structure 10, or by translating SOI structure 10 relative to polishing member 16. In one embodiment, probe beam 34 and polishing member 16 are maintained in a stationary location, and in an opposing relationship, and SOI structure 10 is translated between the probe beam and the polishing member. More than one material removal zone may be applied at one time, such as by using using more than one polishing member.

In certain embodiments, it may be desirable to first perform a rough polishing step employing conventional CMP methods. Once semiconductor layer 14 has been rough polished (i.e. a pre-determined amount of semiconductor material removed from layer 14), additional material is then removed in accordance with the sub-aperture polishing methods of the present invention.

In another embodiment of the present invention, a pseudo-closed loop polishing setup can be applied wherein thickness measurements of the semiconductor layer are performed in the vicinity of the sub-aperture material removal zone (that is, at one or more discrete locations around the material removal zone). This approach is depicted in FIG. 16. Although the intermediate thickness measurements may be performed from the bottom surface of the substrate (the side opposite the semiconductor material, the pseudo-closed loop configuration generally assumes that the bottom surface of the substrate is inaccessible, and therefore provides an alternative to the closed-loop polishing process previously described. If a plurality of thickness measurement locations around the material removal zone are used (via a plurality of probe beams 34), an average thickness for semiconductor layer 14 can be calculated from the measurement data. Obviously, the pseudo-closed loop polishing arrangement does not produce as accurate a polishing operation as the closed loop configuration, in which intermediate thickness measurements of the semiconductor layer are taken at a location of the semiconductor layer within the material removal zone. As with the closed loop polishing configuration, the pseudo-closed loop configuration employs thickness measurements which occur simultaneous with the polishing. Since the measurements are conducted from the same surface of the semiconductor layer as semiconductor material is being removed from, and as close to the material removal zone as possible, if a slurry is used for material removal it may be necessary to provide a relatively clean area on the semiconductor layer at the locations at which the measurement is to be made. This can be easily performed, for example, by providing an air or water jet directed onto the semiconductor material at the desired location. The air jet may also be combined with a stream of cleaning fluid (such as water).

It should be emphasized that the above-described embodiments of the present invention, particularly any "preferred" embodiments, are merely possible examples of implementations, and merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A method of polishing a layer of semiconductor material on a substrate comprising:
   providing a non-planar substrate, the substrate having a first side, a second side, and a layer of semiconductor material on the substrate first side;
   polishing the semiconductor layer to reduce a thickness thereof;
   simultaneous with the polishing, measuring a thickness of the semiconductor layer through the second side of the substrate; and
   using the semiconductor thickness measurement to modify the polishing so as to yield a semiconductor layer having a substantially uniform thickness.

2. The method according to claim 1 wherein the substrate comprises a non-uniform thickness.

3. The method according to claim 1 wherein the semiconductor layer comprises a material selected from the group consisting of silicon (Si), silicon germanium (SiGe), silicon carbide (SiC), germanium (Ge), gallium arsenide (GaAs), GaP, and InP.

4. The method according to claim 1 further comprising supporting the substrate with a fluid bearing.

5. The method according to claim 1 wherein the polishing comprises contact between the semiconductor layer and a polishing member.

6. The method according to claim 1 wherein the polishing comprises plasma assisted chemical etching.

7. The method according to claim 1 wherein the semiconductor layer has a surface area of at least about 0.25 m$^2$.

8. The method according to claim 1 wherein the polishing comprises removing semiconductor material within a sub-aperture material removal zone.

9. The method according to claim 8 wherein the measuring is performed within the material removal zone.

10. The method according to claim 8 further comprising developing relative motion between the material removal zone and the semiconductor layer.

11. A method of polishing a semiconductor layer bonded to a substrate comprising:
providing a non-planar substrate having a first side and a second side and a semiconductor layer bonded to the first side, the semiconductor layer having an exposed surface area;
polishing the semiconductor layer within a sub-aperture material removal zone;
developing relative motion between the sub-aperture material removal zone and the semiconductor layer; and
simultaneous with the polishing, measuring a thickness of the semiconductor layer in the sub-aperture material removal zone; and
using the measured thickness of the semiconductor layer to modify the polishing so as to produce a substantially uniform thickness of the semiconductor layer over the exposed surface area.

12. The method according to claim 11 wherein the measuring is performed through the substrate second side.

13. The method according to claim 11 wherein the measuring is performed from the substrate first side.

14. The method according to claim 11 wherein the polishing comprises using a plurality of sub-aperture material removal zones.

15. A method of polishing a semiconductor layer bonded to a substrate comprising;
providing a substrate having a first side and a second side and a semiconductor layer having an initial thickness bonded to the first side;
polishing the semiconductor layer within a sub-aperture material removal zone;
measuring an intermediate thickness of the semiconductor layer;
using the measured thickness of the semiconductor layer to modify the polishing so as to produce a substantially uniform thickness of the semiconductor layer; and
wherein a surface waviness of the substrate first side is at least about an order of magnitude larger than the initial thickness of the semiconductor layer bonded thereon.

16. The method according to claim 15 wherein the measuring is performed simultaneously with the polishing.

17. The method according to claim 15 wherein the semiconductor layer is measured through the substrate second side.

18. The method according to claim 15 further comprising a plurality of sub-aperture material removal zones.

19. The method according to claim 18 wherein the semiconductor layer is measured through an exposed surface of the semiconductor layer.

* * * * *